(12) United States Patent
Feiweier et al.

(10) Patent No.: US 10,288,706 B2
(45) Date of Patent: May 14, 2019

(54) METHOD AND APPARATUS FOR MAGNETIC RESONANCE FINGERPRINTING WITH B1 INFORMATION ENCODED IN THE DETECTED MAGNETIC RESONANCE SIGNAL

(71) Applicant: Siemens Healthcare GmbH, Erlangen (DE)

(72) Inventors: Thorsten Feiweier, Poxdorf (DE); Gregor Koerzdoerfer, Erlangen (DE); Mathias Nittka, Baiersdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 268 days.

(21) Appl. No.: 15/211,313

(22) Filed: Jul. 15, 2016

(65) Prior Publication Data

US 2018/0017646 A1    Jan. 18, 2018

(51) Int. Cl.
*G01R 33/24*     (2006.01)
*G01R 33/50*     (2006.01)
*G01R 33/561*    (2006.01)

(52) U.S. Cl.
CPC ........... *G01R 33/50* (2013.01); *G01R 33/246* (2013.01); *G01R 33/561* (2013.01)

(58) Field of Classification Search
None
See application file for complete search history.

(56) References Cited

U.S. PATENT DOCUMENTS

| | | | |
|---|---|---|---|
| 2005/0033159 A1* | 2/2005 | Mistretta | G01R 33/563 600/420 |
| 2007/0088416 A1* | 4/2007 | Atalar | A61N 1/05 607/115 |
| 2012/0025823 A1* | 2/2012 | Jellus | G01R 33/5601 324/309 |
| 2013/0249550 A1* | 9/2013 | Feiweier | G01R 33/563 324/309 |

OTHER PUBLICATIONS

Ma et al., "Magnetic Resonance Fingerprinting," Nature 2013.
Jiang et al, "MR Fingerprinting Using Fast Imaging with Steady State Precession (FISP) with Spiral Readout," MRM 2014.
(Continued)

*Primary Examiner* — Melissa J Koval
*Assistant Examiner* — Nasima Monsur
(74) *Attorney, Agent, or Firm* — Schiff Hardin LLP

(57) ABSTRACT

In a method and apparatus for magnetic resonance (MR) fingerprinting, an MR signal is acquired from a subject by radiating radio-frequency (RF) energy that produces an RF transmission field that has a localized amplitude in the subject. The RF energy is radiated with an RF pulse configuration that maps the localized RF field amplitude in the phase of the MR signal from the subject. The detected MR signal is compared to a source of stored MR signal physical or theoretical models that respectively map different localized RF transmission field information in the respective phase thereof, the stored models being respectively for different substances. A substance in the subject from which the detected MR signal curve originated is identified by comparing the detected MR signal curve to the stored models to identify a best match.

19 Claims, 2 Drawing Sheets

(56) References Cited

OTHER PUBLICATIONS

Chen et al, "Magnetic Resonance Fingerprinting (MRF) for Rapid Quantitative Abdominal Imaging," Proc. Intl. Soc. Mag. Reson. Med. 22 (2014).
Buonincontri et al., "MR Fingerprinting with Simultaneous B1 Estimation," MRM 2015.
Ganter et al., "B1+-mapping with the Transient Phase of Unbalanced Steady-State Free Precession," MRM 2013.

* cited by examiner

METHOD AND APPARATUS FOR MAGNETIC RESONANCE FINGERPRINTING WITH B1 INFORMATION ENCODED IN THE DETECTED MAGNETIC RESONANCE SIGNAL

BACKGROUND OF THE INVENTION

Field of the Invention

The present invention concerns methods and magnetic resonance apparatuses for magnetic resonance fingerprinting.

Description of the Prior Art

Absolute properties of the measured object can be determined with the use of quantitative MR imaging techniques, for example the tissue-specific T1 and T2 relaxation in humans. In contrast to this, the conventional sequences that are most often used in clinical routine generate only a relative signal intensity of different tissue types (known as weightings), such that the diagnostic interpretation is susceptible to a high degree of subjective estimation by the radiologist. Quantitative techniques offer the advantage of an objective comparability, but are presently not routinely used due to their long measurement times.

The disadvantage of the long measurement times could be decreased to an acceptable degree with the use of new measurement methods such as MR fingerprinting (see Ma D. et al., "Magnetic Resonance Fingerprinting," Nature 2013). The principle of this method is to compare measured signal curves with a plurality of theoretical signal curves. The collection of the signals, which might be simulated in advance, is designated as a "dictionary". Signal curves can be simulated for various combinations of T1 and T2 relaxation times, for example. The T1 and T2 times of a pixel in an image are determined by comparing the measured signal curve thereof with all simulated signal curves. This process is designated as "matching". The simulated curve that is most similar to the measured signal curve determines the relaxation parameters T1 and T2 of the pixel. Another way of comparing measured signals is to fit the measured data to a set of physical conditions. An example of this method is the application of a Kalman filter.

Multi-dimensional dictionaries are also possible that include additional parameters such as diffusion and/or magnetization transfer. Dictionaries are also possible that represent a mixture of different tissues within a single voxel.

In principle, any echo technique in combination with any method for k-space sampling (Cartesian, spiral, radial) may be used for this method. Presently, a "Fast Imaging with Steady-state Precession" (FISP) sequence in combination with a spiral sampling is preferably used. After an adiabatic 180° inversion pulse for targeted disruption of the steady state, a pseudorandomized flip angle series is radiated and every resulting echo is read out with an individual spiral. In this procedure, n RF pulses are used that generate similarly many echoes. From the n individual images, for each pixel a signal curve is extracted that is compared with the simulated curves (see Jiang Y. et al, "MR Fingerprinting Using Fast Imaging with Steady State Precession (FISP) with Spiral Readout," MRM 2014).

Theoretical and experimental tests have shown that this method is susceptible to inhomogeneities of the RF transmission field (B1+). A deviation of the real applied flip angle curve from the theoretical leads to a markedly deviating measured signal curve. This is incorrectly associated upon comparison with the physical model, which has the consequence of an incorrect determination of the relaxation parameters.

One possibility to solve this problem is to expand the original physical model (with the input parameters T1 and T2) by B1+. This means, for example, using multiple two-dimensional dictionaries that are simulated for various B1+ values. Without the influence of interference effects such as undersampling artifacts, noise etc., the three parameters T1, T2 and B1+ could theoretically be determined exactly with these methods. In a real experiment, however, it has appeared that the very similar entries in the three-dimensional dictionary are not suitable for a robust matching, and small interfering influences may already severely falsify the result.

Another possibility (see Y. Chen et al, "Magnetic Resonance Fingerprinting (MRF) for Rapid Quantitative Abdominal Imaging," Proc. Intl. Soc. Mag. Reson. Med. 22 (2014)) provides to acquire a B1+ map in addition to the MR fingerprinting. The parameter B1+ can then be incorporated in the theoretical model as prior knowledge. In context of dictionary MRF, from multiple dictionaries that are simulated for various B1+ values, the matching dictionary with regard to B1+ may thus be selected for the comparison process for each pixel. The increased scan time due to the upstream or downstream acquisition of the B1 map thereby has a disadvantageous effect. Furthermore, the acquired B1 maps in part possess severe inaccuracies depending on the method that is used. For example, if the subject moves between the acquisition of the B1+ map and the MRF measurement, additional registration steps will be required in order to ensure consistent results.

Another method utilizes abrupt changes to the flip angle at the end of the regular MRF coding (see G. Buonincontri et al., "MR Fingerprinting with Simultaneous B1 Estimation," MRM 2015). In this method, 15 pulses with 90° flip angle thereby follow 15 pulses with 0° flip angle. The oscillations that are thereby observable are then approximately proportional to the real applied flip angle, and therefore to the B1+ field. This effect is already utilized for B1 mapping (see C. Ganter et al., "B1+-mapping with the Transient Phase of Unbalanced Steady-State Free Precession," MRM 2013). A Cartesian, undersampled 3D acquisition scheme is used for this method. Here the very long scan time that is necessary for the Cartesian sampling has a disadvantageous effect. The precision of the method is limited by the undersampling artifacts. In order to shorten the measurement time, higher undersampling rates (for example as with spiral imaging) must be used. It is to be expected that the undersampling artifacts with similar frequency that superimpose on the oscillations falsify the results.

SUMMARY OF THE INVENTION

An object of the present invention is to provide a method and an apparatus for improved magnetic resonance fingerprinting wherein the problems noted above are avoided or at least alleviated.

This object is achieved in accordance with the invention by a method and MR apparatus that integrate additional B1+-dependent information into the signal curve measured in MR fingerprinting. The basis of the invention is to translate variations of the local amplitude of the B1+ field into a corresponding variation of the phase of the acquired MR signals by the use of special RF excitation pulses. Since the comparison of the signal curves with the theoretical model is implemented with complex values, the additional dependency of the measurement data on the B1+ amplitude—which additional dependency is obtained in such a manner—helps to obtain an unambiguous association of the associated entry (T1, T2 and B1+). Suitable RF excitation pulses that map the local B1+ amplitudes as phase information of the MR signal are known from the field of the acquisition of B1+ maps (U.S. Pat. No. 7,064,546 B2), for example.

In a preferred embodiment of the invention, the variations of the local amplitude of the B1+ field into a corresponding variation of the phase of the acquired MR signals is achieved by the use of an RF pulse sequence wherein two successive RF pulses have a phase offset. Such a phase offset causes the nuclear spins to be rotated by the second of these successive RF pulses around an axis that is not the same as for the first of these two RF pulses. If the phase offset is 90°, for example, the second axis is orthogonal to the first axis, which means that the signal generated by the nuclear spins excited by the second pulse is completely orthogonal to the signal generated by the nuclear spins excited by the first pulse. A rotational axis of the second pulse that is rotated by an arbitrary angle, however, will always create a signal that has a contribution (in the vector sense) that is orthogonal to the signal resulting from the first pulse and another contribution (in the vector sense) that is parallel to the signal resulting from the first pulse. An offset of 0° or 180° produces a completely parallel signal, and an offset of 90° or 270° generates a completely orthogonal signal. It is therefore possible to use a smaller or larger phase offset than 90° between the two pulses, but with higher flip angles and/or different flip angles for the first pulse and the second pulse.

In general, the offset must be sufficient so as to produce a B1+ dependent phase in the received MR signal.

DESCRIPTION OF THE PREFERRED EMBODIMENTS

Figure 1:
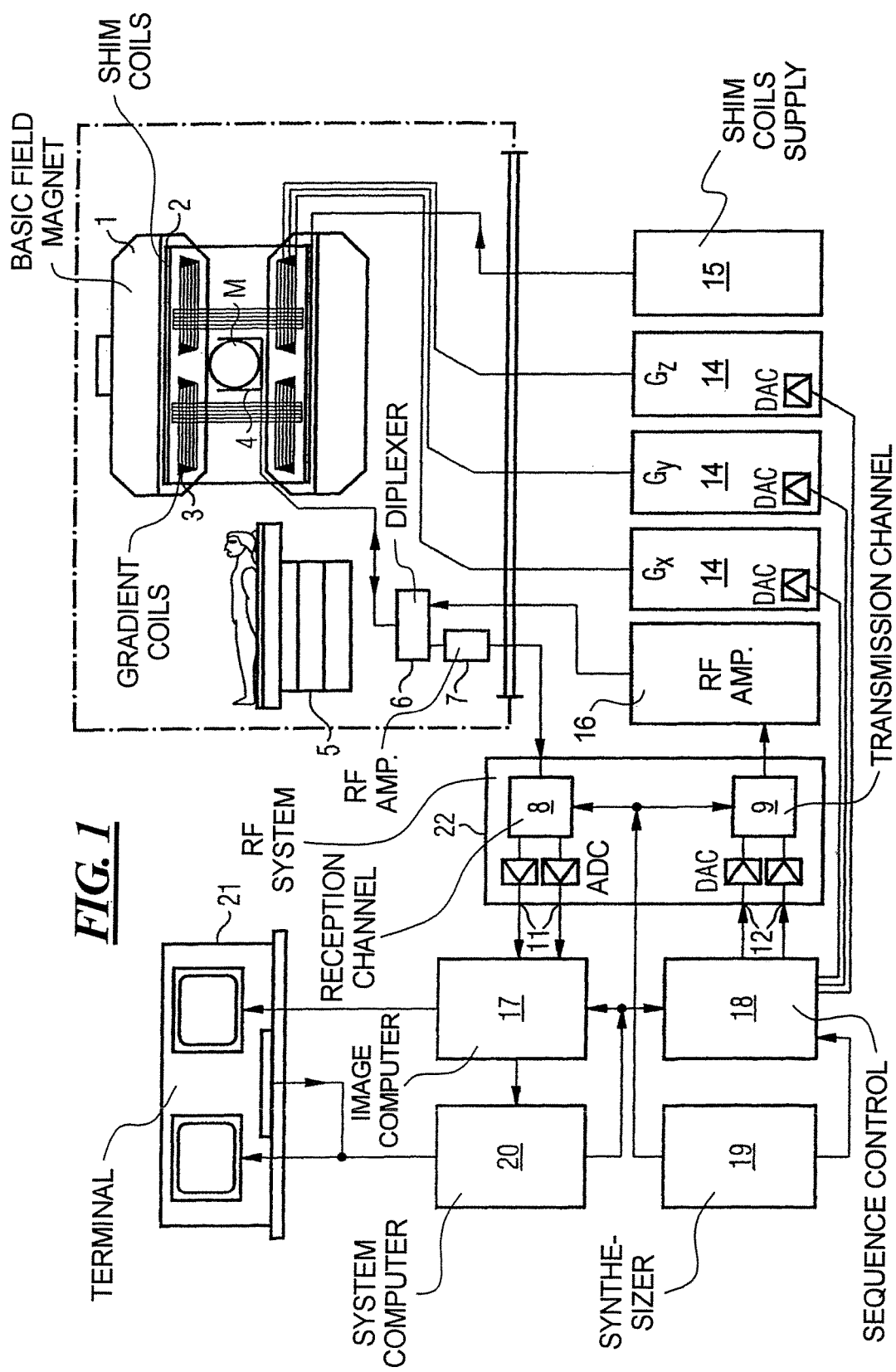
FIG. 1 schematically illustrates a magnetic resonance apparatus constructed and operating in accordance with the present invention.

FIG. 1 schematically illustrates a magnetic resonance apparatus (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 5 in order to be moved into the magnetic resonance apparatus. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 15 for the shim-coils 2.

A gradient coil system 3 is incorporated in the basic field magnet 1, composed of three windings. Each winding is supplied by a corresponding amplifier 24-26 with power for generating a linear gradient field in a respective axis of a Cartesian coordinate system. The first partial winding of the gradient field system 3 generates a gradient $G_x$ in the x-axis, the second partial winding generates a gradient $G_y$ in the y-axis, and the third partial winding generates a gradient $G_z$ in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28, serving as a single RF source for the one or more RF transmitting coils.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

In accordance with the invention, the nuclear spins are excited with an RF pulse sequence that is designed in order to give the received (detected) MR signal that results from the excited nuclear spins, a phase that is B1+ dependent. This is preferably achieved by radiating two successive RF pulses in the pulse sequence with a phase offset that is sufficient to produce the B1+ dependency.

Figure 2:
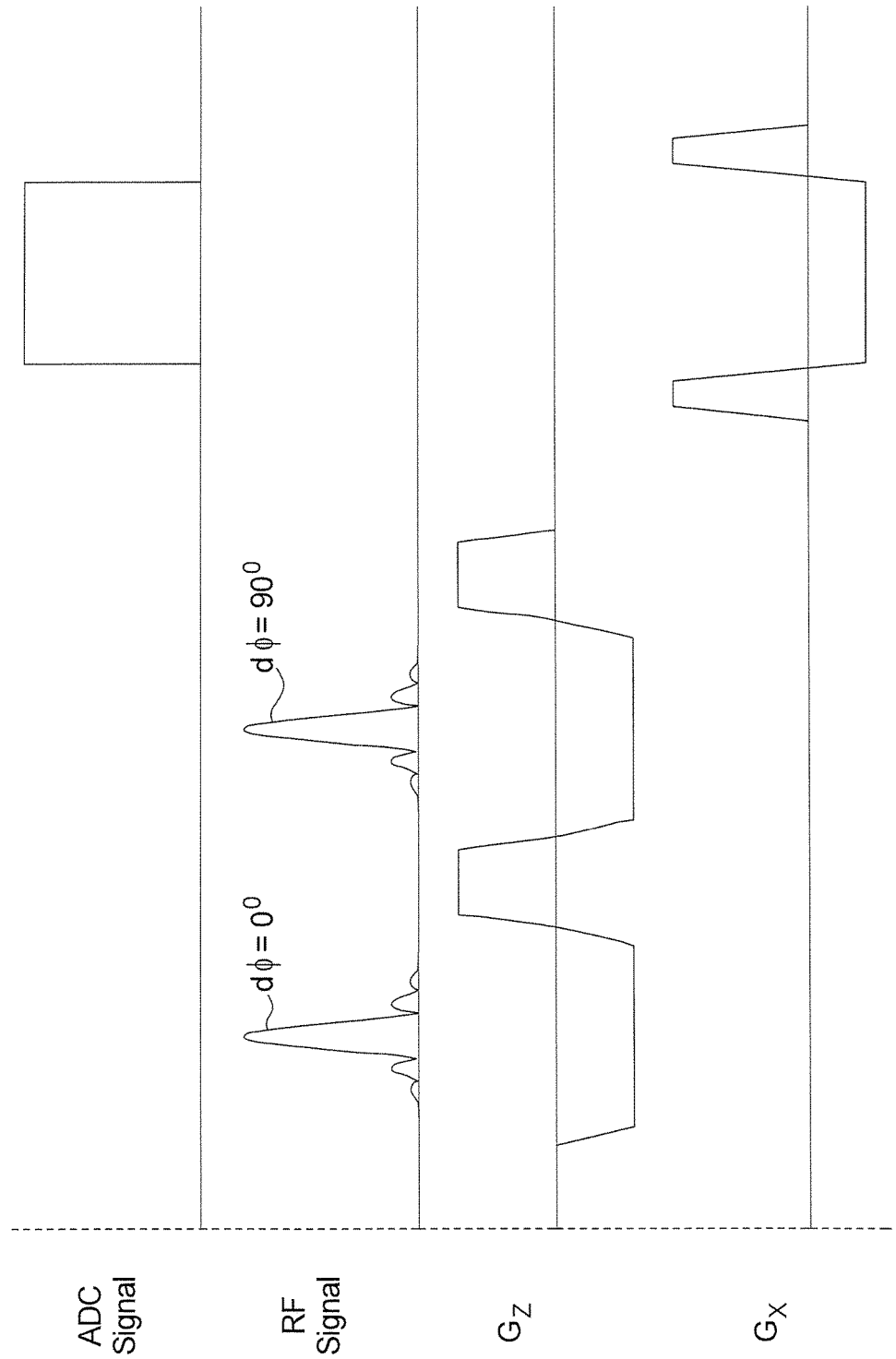
FIG. 2 shows an exemplary embodiment of a magnetic resonance data acquisition pulse sequence in accordance with the present invention.

The exemplary embodiment of an inventive pulse sequence shown in FIG. 2 uses, as an example, a pulse configuration (RF signal) composed of two 90° phase-offset pulses of arbitrary flip angle. This replaces each of the conventional pulses that all have constant phase. The respective first pulse rotates the nuclear spins for a specified time around an axis orthogonal to the direction of the basic magnetic field $B_0$. The following second pulses likewise rotates the nuclear spins but around an axis that is orthogonal to $B_0$ and to the rotation axis of the first pulse. The resulting phase of the signal then depends on the applied flip angles. In a converse argument, a deviation of the measured phase from the phase simulated with the same configuration means that other real flip angles have been applied. These differences of the flip angles originate from the inhomogeneity of the B1 field. The composite pulse replaces all conventional pulses except for the adiabatic inversion pulse. The new technique thus varies the phase over the entire signal curve and supplements this with an additional, previously unused information.

The resulting magnetic resonance signal (ADC signal) is acquired using a signal encoding gradient $G_x$ in the z-direction of a Cartesian coordinate system for slice selection, and readout gradients $G_x$ and $G_y$ in the x-direction and the y-direction, respectively.

This additional phase information is primarily dependent on B1+ and may be used in order to differentiate signals more strongly relative to B1+. The comparison with a physical model including the B1+ dimension may be significantly improved via this differentiation.

The important feature of the invention is in the expansion of a conventional MR fingerprinting method by the additional B1+-dependent phase information. This is accomplished by the introduction of the composite pulse that is composed of two 90° phase-offset pulses of arbitrary flip angle.

Advantages of the invention include the integration of a B1+-dependent information in the measured signal. Complete time duration of the experiment is used for the measurement of all three parameters (T1, T2 and B1+) simultaneously. Therefore, there is no necessity for B1+maps, and time cost that these entail. Errors due to wrong or inaccurate B1+ maps are avoided.

A further advantage is that consideration of the B1+ information is completely integrated into the MR fingerprinting concept, which in turn achieves advantages such as robustness to movement.

The design of the RF pulses may vary across the pulse train.

For example, only a portion of the standard RF pulses may be replaced by the special variant. For example, the dependency of the MR signal phase on the B1+ amplitude may be varied across the pulse train. For example, the relative phase of the two sub-pulses may be varied continuously (i.e. in steps<90°) or discretely across the pulse train. For example, the slice profile (curve of the B1 field in the slice cross section) may be varied in order to better model influences of the non-ideal, "rectangular" slice profile.

Interfering influences of signal evolutions between the sub-pulses may be reduced by the use of asymmetrical RF sub-pulses (center of the first sub-pulse chronologically after and of the second sub-pulse chronologically before).

A non-selective RF pulse with a phase modulation may be used in the context of 3D MR fingerprinting methods (see U.S. Pat. No. 7,064,546 B2).

Instead of composite RF pulses, a B1+-dependent phase information may be generated, such as by using special frequency-modulated RF pulses (for example AHP pulses, see U.S. Pat. No. 8,258,786 B2).

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for magnetic resonance fingerprinting, comprising:

operating a magnetic resonance scanner, while a subject is situated therein, with a magnetic resonance data acquisition pulse sequence to acquire a magnetic resonance signal from the subject and, in said pulse sequence, radiating radio-frequency (RF) energy in the magnetic resonance scanner that produces an RF transmission field, said RF transmission field having a localized amplitude in the subject, and said magnetic resonance signal having a signal curve exhibiting a magnitude and a phase;

operating said magnetic resonance scanner in said pulse sequence to radiate said RF energy with an RF pulse configuration that maps said localized RF field amplitude in the phase of the magnetic resonance signal;

operating the magnetic resonance scanner in the pulse sequence to detect the magnetic resonance signal from the subject;

in a computer provided with said magnetic resonance signal acquired from one subject, accessing a source of stored physical or theoretical models that respectively map different localized RF transmission field information in the respective phase thereof, said stored models being respectively produced for different substances;

in said computer, identifying a substance in the subject from which the detected magnetic resonance signal curve originated by comparing the signal curve of the detected magnetic resonance signal from the subject to the stored models and identifying one of the stored models that is a best match to the signal curve of the detected magnetic resonance signal from the subject; and generating an electronic signal in said computer that designates said substance from which the detected magnetic resonance signal originated, and making said electronic signal available as an output from said computer.

2. A method as claimed in claim 1 comprising operating said magnetic resonance scanner to radiate said RF energy while a basic magnetic field, having a basic magnetic field direction, is produced in said magnetic resonance scanner, and radiating said RF energy with said pulse configuration comprising two phase-offset pulses having respective arbitrary flip angles, with a first of said two phase-offset pulses rotating nuclear spins in the subject for a predetermined time around a first axis relative to said basic magnetic field direction, and a second of said phase-offset pulses rotating the nuclear spins around a second axis relative to said basic magnetic field direction and to said first axis, thereby giving said magnetic resonance signal a phase that is dependent on said localized RF field amplitude.

3. A method as claimed in claim 2 comprising operating said magnetic resonance scanner to repeat said pulse sequence in multiple repetitions, with the respective flip angles of the two phase-offset pulses being different in at least some of said repetitions.

4. A method as claimed in claim 2 comprising operating said magnetic resonance scanner to repeat said pulse sequence in multiple repetitions, with a difference of the respective flip angles of the two phase-offset pulses being varied incrementally in steps from repetition-to-repetition.

5. A method as claimed in claim 2 wherein said two phase-offset pulses are offset in phase by 90° or 270°.

6. A method as claimed in claim 1 comprising operating said magnetic resonance scanner to repeat said pulse sequence in multiple repetitions and radiating said RF energy with said RF pulse configuration that maps said RF transmission field amplitude in said phase of the magnetic resonance signal only in at least one, but not all, of said repetitions.

7. A method as claimed in claim 1 comprising operating said magnetic resonance scanner to radiate said RF energy with said pulse configuration comprising chronologically asymmetrical RF pulses.

8. A method as claimed in claim 1 comprising operating said magnetic resonance scanner with said pulse sequence to acquire 3D magnetic resonance data from said signal curve, and radiating said Rf energy with said pulse configuration comprising a non-selective RF pulse with phase modulation.

9. A method as claimed in claim 1 comprising operating said magnetic resonance scanner to radiate said RF energy with said RF pulse configuration comprising frequency-modulated RF pulses.

10. A magnetic resonance apparatus comprising:
a magnetic resonance scanner having a basic field magnet and a radio-frequency (RF) radiator;
a control computer configured to operate the magnetic resonance scanner, while a subject is situated therein, with a magnetic resonance data acquisition pulse sequence to acquire a magnetic resonance signal from the subject and, in said pulse sequence, radiating radio-frequency (RF) energy in the magnetic resonance scanner from said RF radiator that produces an RF transmission field, said RF transmission field having a localized amplitude in the subject, and said magnetic resonance signal having a signal curve exhibiting a magnitude and a phase;
said control computer being configured to operate said magnetic resonance scanner in said pulse sequence to radiate said RF energy from said RF radiator with an RF pulse configuration that maps said localized RF field amplitude in the phase of the magnetic resonance signal;
said control computer being configured to operate the magnetic resonance scanner in the pulse sequence to detect the magnetic resonance signal from the subject;
a processor provided with said magnetic resonance signal acquired from one subject, said processor being configured to access a source of stored physical or theoretical models that respectively map different localized RF transmission field information in the respective phase thereof, said stored models being respectively produced for different substances;
said processor being configured to identify a substance in the subject from which the detected magnetic resonance signal curve originated by comparing the signal curve of the detected magnetic resonance signal from the subject to the stored models and identifying one of the stored models that is a best match to the signal curve of the detected magnetic resonance signal from the subject; and
said processor being configured to generate an electronic signal that designates said substance from which the detected magnetic resonance signal originated, and to make said electronic signal available as an output from said processor.

11. An apparatus as claimed in claim 10 wherein said control computer is configured to operate said magnetic resonance scanner to radiate said RF energy while producing a basic magnetic field with said basic field magnet, said basic magnetic field having a basic magnetic field direction, in said magnetic resonance scanner, and to radiate said RF energy from said RF radiator with said pulse configuration comprising two phase-offset pulses having respective arbitrary flip angles, with a first of said two phase-offset pulses rotating nuclear spins in the subject for a predetermined time around a first axis relative to said basic magnetic field direction, and a second of said phase-offset pulses rotating the nuclear spins around a second axis relative to said basic magnetic field direction and to said first axis, thereby giving said magnetic resonance signal a phase that is dependent on said localized RF field amplitude.

12. An apparatus as claimed in claim 11 wherein said control computer is configured to operate said magnetic resonance scanner to repeat said pulse sequence in multiple repetitions, with the respective flip angles of the two phase-offset pulses being different in at least some of said repetitions.

13. An apparatus as claimed in claim 11 wherein said control computer is configured to operate said magnetic resonance scanner to repeat said pulse sequence in multiple repetitions, with a difference of the respective flip angles of the two phase-offset pulses being varied incrementally in steps from repetition-to-repetition.

14. A magnetic resonance apparatus as claimed in claim 10 wherein said control computer is configured to operate said magnetic resonance scanner to radiate said RF energy from said RF radiator with said two phase-offset pulses having a phase offset of 90° or 270°.

15. An apparatus as claimed in claim 10 wherein said control computer is configured to operate said magnetic resonance scanner to repeat said pulse sequence in multiple repetitions and to radiate said RF energy from said RF radiator with said RF pulse configuration that maps said RF transmission field amplitude in said phase of the magnetic resonance signal only in at least one, but not all, of said repetitions.

16. An apparatus as claimed in claim 10 wherein said control computer is configured to operate said magnetic resonance scanner to radiate said RF energy from said RF radiator with said pulse configuration comprising chronologically asymmetrical RF pulses.

17. An apparatus as claimed in claim 10 wherein said control computer is configured to operate said magnetic resonance scanner with said pulse sequence to acquire 3D magnetic resonance data from said signal curve, and to radiate said Rf energy from said RF radiator with said pulse configuration comprising a non-selective RF pulse with phase modulation.

18. An apparatus as claimed in claim 10 wherein said control computer is configured to operate said magnetic resonance scanner to radiate said RF energy from said RF radiator with said RF pulse configuration comprising frequency-modulated RF pulses.

19. A non-transitory, computer-readable data storage medium encoded with programming instructions, said storage medium being loaded into a control and evaluation computer of a magnetic resonance apparatus, comprising a magnetic resonance scanner, and said programming instructions causing said control and evaluation computer to:

operate said magnetic resonance scanner, while a subject is situated therein, with a magnetic resonance data acquisition pulse sequence to acquire a magnetic resonance signal from the subject and, in said pulse sequence, radiate radio-frequency (RF) energy in the magnetic resonance scanner that produces an RF transmission field, said RF transmission field having a localized amplitude in the subject, and said magnetic resonance signal having a signal curve exhibiting a magnitude and a phase;

operate said magnetic resonance scanner in said pulse sequence to radiate said RF energy with an RF pulse configuration that maps said localized RF field amplitude in the phase of the magnetic resonance signal;

operate the magnetic resonance scanner in the pulse sequence to detect the magnetic resonance signal from the subject;

access a source of stored physical or theoretical models that respectively map different localized RF transmission field information in the respective phase thereof, said stored models being respectively produced for different substances;

identify a substance in the subject from which the detected magnetic resonance signal curve originated by comparing the signal curve of the detected magnetic resonance signal from the subject to the stored models and identifying one of the stored models that is a best match to the signal curve of the detected magnetic resonance signal from the subject; and generate an electronic signal in said computer that designates said substance from which the detected magnetic resonance signal originated, and make said electronic signal available as an output from said control and evaluation computer.

* * * * *